United States Patent [19]

Henderson et al.

[11] Patent Number: 5,021,356

[45] Date of Patent: Jun. 4, 1991

[54] METHOD OF MAKING MOSFET DEPLETION DEVICE

[75] Inventors: Mark F. Henderson; John R. Schlais, both of Kokomo, Ind.

[73] Assignee: Delco Electronics Corporation, Kokomo, Ind.

[21] Appl. No.: 437,241

[22] Filed: Nov. 16, 1989

Related U.S. Application Data

[62] Division of Ser. No. 399,565, Aug. 24, 1989.

[51] Int. Cl.$^5$ ............................................ H01L 21/265
[52] U.S. Cl. ................................. 437/45; 437/46; 437/34; 437/40
[58] Field of Search ............... 437/45, 46, 34, 40, 437/41; 357/23.12

[56] References Cited

U.S. PATENT DOCUMENTS

| 4,315,781 | 2/1982 | Henderson | 357/23.12 |
| 4,420,344 | 12/1983 | Davies et al. | 437/46 |
| 4,422,885 | 12/1983 | Brower et al. | 437/46 |
| 4,435,896 | 3/1984 | Parrillo et al. | 437/45 |
| 4,555,842 | 12/1985 | Levinstein et al. | 437/34 |
| 4,599,789 | 7/1986 | Gasner | 357/42 |
| 4,703,552 | 11/1987 | Baldi et al. | 437/45 |
| 4,786,611 | 11/1988 | Pfiester | 437/45 |
| 4,845,047 | 7/1989 | Holloway et al. | 437/45 |
| 4,866,002 | 12/1989 | Shizukuishi et al. | 437/34 |

Primary Examiner—Brian E. Hearn
Assistant Examiner—Trung Dang
Attorney, Agent, or Firm—Domenica N. S. Hartman

[57] ABSTRACT

A p-channel depletion device in a MOSFET is formed and preferably comprises a silicon substrate, an N-well region, P+ source and drain regions, and a polysilicon gate which has been appropriately doped to be of a P−conductivity type. The resulting structure performs analogously to a depletion device formed in accordance with conventional methods wherein a depletion mask and implant are utilized and are characterized by a threshold voltage of approximately +250 millivolts or greater.

1 Claim, 2 Drawing Sheets

METHOD OF MAKING MOSFET DEPLETION DEVICE

This is a division of application Ser. No. 399,565 filed on Aug. 24, 1989.

This invention generally relates to integrated circuit fabrication techniques. More particularly, this invention relates to the creation of a P-channel depletion mode device within a metal-oxide-semiconductor field-effect transistor (MOSFET).

BACKGROUND OF THE INVENTION

In metal-oxide-semiconductor (MOS) monolithic integrated circuit technology, field-effect transistors (FET's) are the essential components, acting as both active and passive components. MOSFET's are formed with p-type channels or n-type channels. It is desirable at times to operate these devices in a depletion mode. Typically, depletion occurs when the channel is heavily doped with an appropriate species to form, simplistically speaking, an electrical short in the channel between the source and drain regions of the FET. This results in the device being "on", even though the applied voltage to the gate is zero.

This depletion mode affects the threshold voltage of the transistor. The threshold voltage is that voltage which must be applied to result in mobility of the electronic charge carriers across the channel. The threshold voltage is dependent on many characteristics of the FET including not only the doping density of the channel region or depletion zone, but also the work function difference between the gate and the silicon substrate, the oxide thickness and permittivity, the surface-state charge density and the distributed charge in the oxide.

Generally, variations in device threshold voltages, such as that caused by depletion, are preferably achieved through separate dopant implants into the channel of the device. This requires additional process steps and masks. In particular, the depletion zone is typically formed using ion implantation techniques wherein an appropriate species is implanted into the channel region to form the depletion zone. However, a shortcoming associated with this method as stated previously, is that generally additional mask and implant steps are required to form this depletion zone. As widely known throughout the electronics industry, it is desirable to minimize or alleviate the number of processing steps, particularly those that require masking and alignment procedures.

Therefore, it would be desirable to provide a method for forming a depletion device within an MOSFET which does not require the additional processing steps associated with the conventional masking and implanting methods for forming these devices. It would be extremely desirable if such method were compatible with currently utilized processing steps.

SUMMARY OF THE INVENTION

It is an object of our invention to provide a p-channel depletion device and method for forming such a device.

It is a further object of this invention that such device be formed using conventional CMOS techniques with polysilicon resistors without additional masking, implanting or processing steps.

In accordance with a preferred embodiment of this invention, these and other objects and advantages are accomplished as follows.

This invention comprehends a p-channel depletion device in a MOSFET and a method for forming the same. The p-channel depletion device comprises an N-well region within an appropriate substrate such as silicon, P+ source and drain regions within said N-well region and a P- polysilicon gate region.

In accordance with a preferred embodiment of this invention, the preferred method for forming the p-channel depletion device comprises the following steps. Using conventional CMOS technology, the resistor mask used for forming the polysilicon resistors masks the P-type gate. Therefore, the P-gate does not receive the normal heavy phosphorus diffusion used to form the low resistance N-type polysilicon gate and interconnect regions. After this phosphorus doping, the resistor mask is removed, and the N+ source/drain mask is applied. Once the N+ source/drains are implanted and formed, the N+ mask is removed, and the P+ mask is applied. Here, the lightly doped gate of the P-channel device is counterdoped heavily P+, while the P-gate is counter doped with boron during the formation of the P+ source and drain regions. It is during this doping step of the P+ source and drain regions that the polysilicon gate, which was not doped previously, is doped so as to be characterized by P- conductivity type. The resulting device performs analogously to a P-channel depletion device and is characterized by a change in threshold voltage of approximately +1 volt or greater, to a threshold voltage of approximately +250 millivolts.

The formation of this depletion device is accomplished using normal CMOS processing with polysilicon resistors. During processing, the resistor mask used for formation of the polysilicon resistor, is used to block the normal phosphorus doping of the p-channel polysilicon gate. The gate is then subsequently counterdoped during the implanting of the P+ source and drain regions. With this invention, a depletion implant is not utilized, thereby alleviating the additional masking and implant steps associated with the formation of the depletion device.

The teachings of this invention may also be utilized with an n-channel device. The resulting n-channel device features small positive threshold voltage shifts, and therefore may be useful as a comparator-type device.

Other objects and advantages of this invention will be better appreciated from the following detailed description.

DETAILED DESCRIPTION OF THE INVENTION

Figure 1:
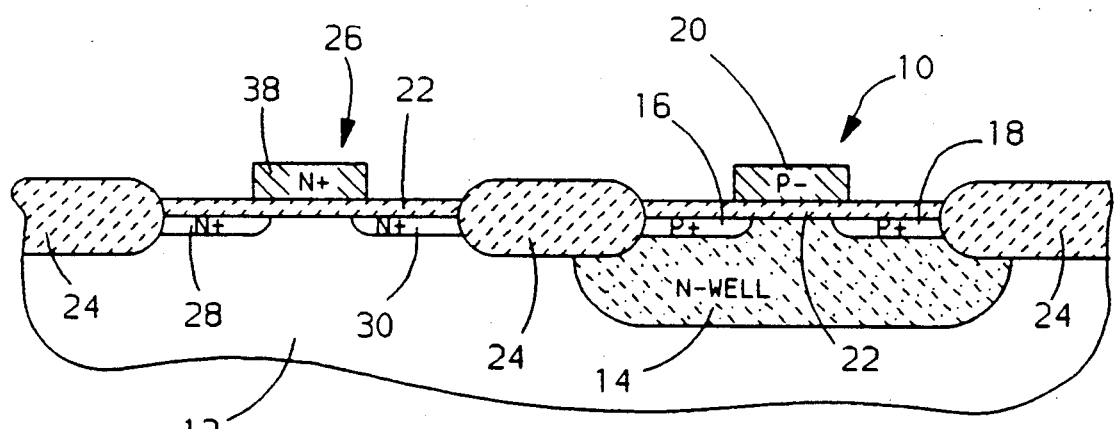
FIGS. 1-8 illustrate the preferred processing steps for formation of the p-channel depletion device in accordance with this invention.

A p-channel depletion device 10 in a MOSFET is formed. As shown in FIG. 1, the p-channel depletion device 10 comprises an appropriate substrate 12 such as silicon, an N-well region 14 diffused into the substrate 12, source and drain regions, 16 and 18 respectively, which have been doped to be of a P+ conductivity type, and a polysilicon gate 20 which has been appropriately doped to be of a P- conductivity type. The resulting structure 10 performs analogously to a depletion device formed in accordance with conventional methods wherein a depletion implant is utilized and is characterized by a threshold voltage of approximately -1 volt. Conventional gate oxide 22, field oxide 24 and a complimentary n-channel transistor 26 are also present.

Simplistically, a conventional p-channel MOSFET is converted into a depletion mode device by using the resistor mask used for formation of the polysilicon resistors, to block the normally heavy phosphorus doping of the P-type polysilicon gate 20. Then, when the p-channel device receives its normal P+ source/drain implant, the polysilicon gate 20 becomes doped by boron to P− type conductivity. The difference in doping species and relative concentration creates a significant positive offset of approximately 1.0–1.5 Volt (depending on the original gate implant dose) in the p-channel threshold. The resulting device is characterized by a threshold voltage of approximately +250 millivolts. A conventional p-channel device is characterized by a threshold voltage of approximately −750 millivolts. The p-channel polysilicon gate 20 of the device is then electrically connected back to the source 16, creating a $V_{gs}=0V$ situation, resulting in a depletion load.

The preferred method for forming this p-channel depletion device is the following.

Figure 2:
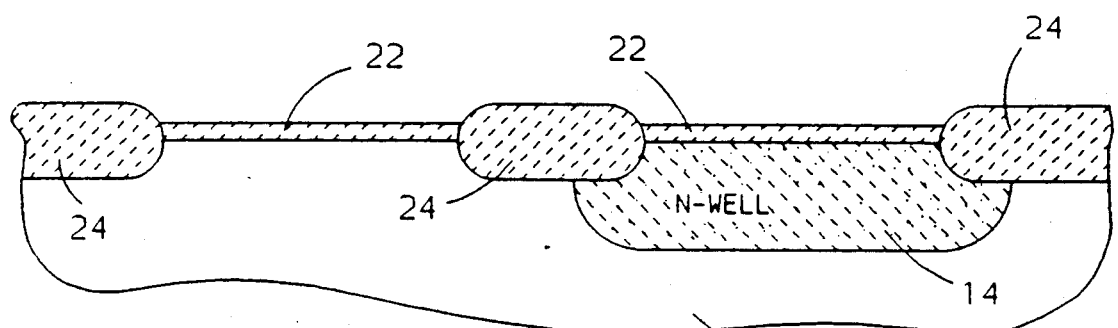

As shown in FIG. 2, first, using conventional techniques an N-well region 14 is formed within an appropriate substrate 12 such as single crystal silicon. Gate oxide 22 and field oxide 24 have also been formed using conventional techniques.

Figure 3:
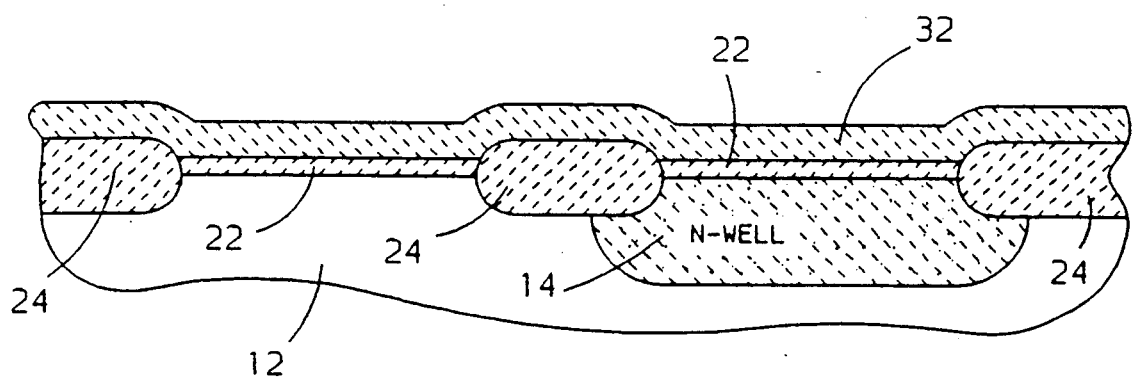

As shown in FIG. 3, a blanket layer of polysilicon 32 is deposited everywhere. The resistor implants are then applied by doping the blanket layer of polysilicon 32. The polysilicon 32 is doped using conventional dosages of phosphorus to result in the polysilicon layer 32 having a N− type conductivity characterized by a resistance of approximately 750 ohms per square.

Figure 4:
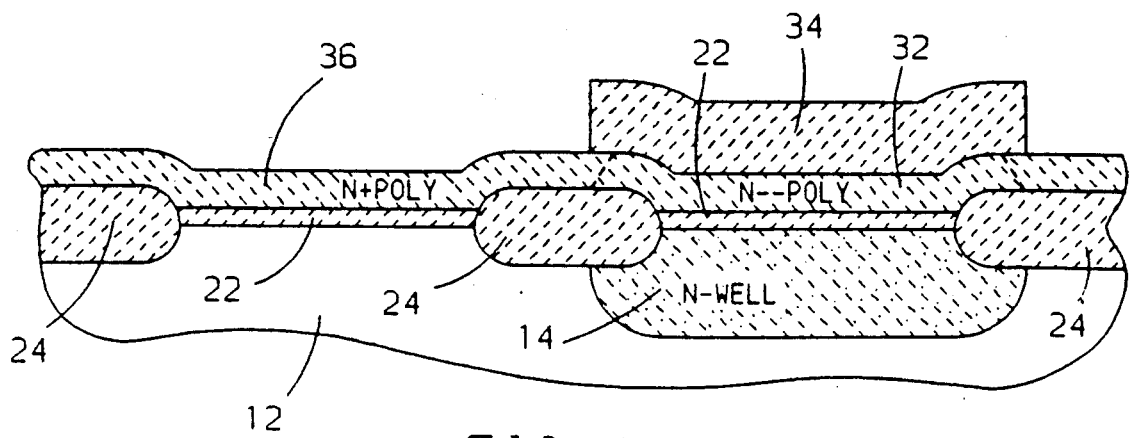

As shown in FIG. 4, regions 34 of low temperature oxide are conventionally deposited and patterned. This is accomplished by first depositing a layer of low temperature oxide and densifying the oxide, then depositing a photoresist resistor mask and patterning the mask using a hydrofluoric acid etch through the unprotected low temperature oxide layer, followed by a photoresist strip to retain the patterned regions of low temperature oxide. In those regions not masked by the regions 34 of low temperature oxide, a phosphorus diffusion is used to convert the N− type polysilicon layer 32 to a N+ type conductivity region 36 characterized by a resistance of approximately 30 ohms per square.

Figure 5:
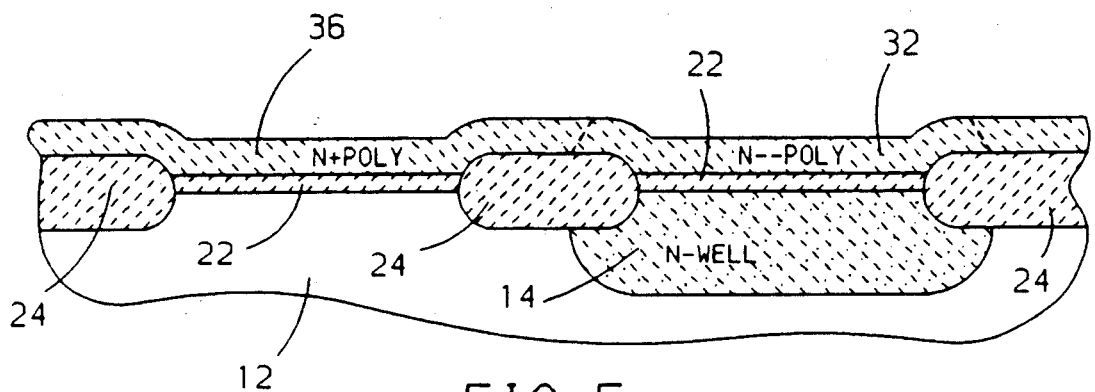

As shown in FIG. 5, the patterned regions of low temperature oxide are then removed using a conventional hydrofluoric acid oxide etch back process. This results in a resistor structure having adjacent areas of N+ polysilicon 36 and N− polysilicon 32.

Figure 6:
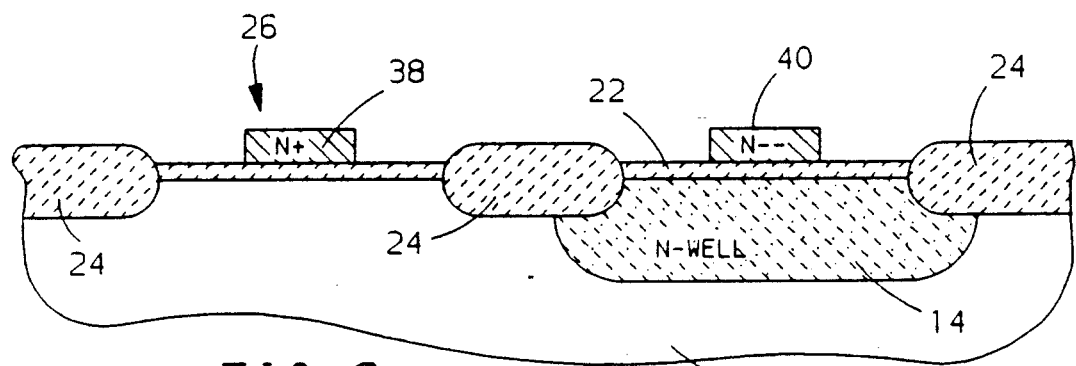

The polysilicon gate regions 38 and 40 are formed next as shown in FIG. 6. The polysilicon layer 32 is masked with an appropriate photoresist, conventionally etched and then the photoresist stripped. This results in an N− gate 40 over the N-well region 14 and an N+ gate 38 over the corresponding n-channel transistor 26.

Figure 7:
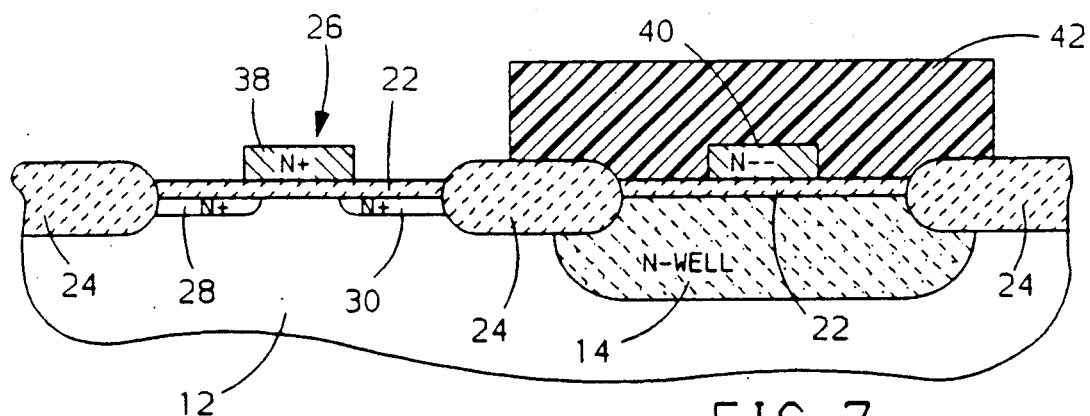

Source and drain regions 28 and 30 are now formed in the corresponding n-channel transistor 26, as shown in FIG. 7. First, a photoresist mask 42 is deposited and patterned so as to mask the N− gate 40 over the N-well region 14. The N+ source and drain regions 28 and 30 are then formed by implanting phosphorus or other appropriate dopant into the source and drain regions of the unmasked n-channel transistor 26. The N+ source and drain regions 28 and 30 are self-aligned by the N+ gate 38. During this step, the N− gate 40 over the N-well region 14 in the p-channel device is masked from receiving any dopant. Lastly, the photoresist mask 42 is removed.

Figure 8:
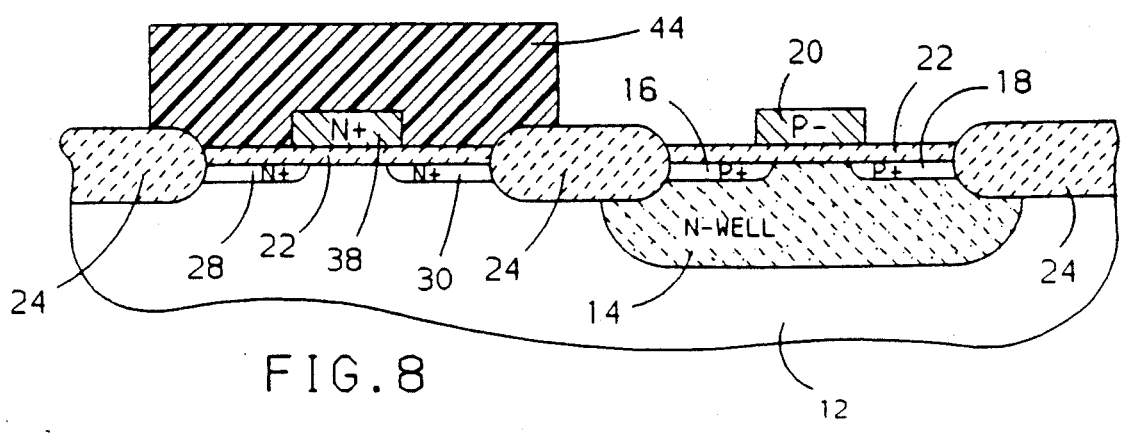

As shown in FIG. 8, the p-channel source and drain 16 and 18 are formed while also appropriately doping the corresponding gate 20. This is accomplished by first masking the n-channel transistor 26 using a conventional photoresist mask 44. The P+ source and drain regions 16 and 18 are then formed by implanting an appropriate dosage of boron so as to result in a resistance of approximately 100 ohms per square. The polysilicon p-channel gate 20 which was previously N− type conductivity also receives the boron doping and becomes characterized by P- type conductivity having a resistance of approximately 300 ohms per square. The photoresist mask 44 protecting the n-channel transistor 26 is removed.

The resulting structure is shown in FIG. 1. The p-channel depletion 10 device performs analogously to a depletion mode device wherein the threshold voltage is approximately +250 millivolts, resulting in a change of approximately 1.0–1.5 Volts. The n-channel transistor 26 is characterized by a conventional threshold voltage of approximately +750 millivolts. With this invention, a depletion implant is not utilized, thereby alleviating the additional masking and implant steps associated with the formation of the depletion device.

The teachings of this invention may also be utilized with an n-channel device. The resulting n-channel device features small positive threshold voltage shifts, and therefore it may be useful as a comparator-type device. For the n-channel device, the resistor mask is used to block the normal heavy phosphorus doping of the gate. The gate is then counterdoped with the normal N+ source drain implant. A relatively small but consistent offset is created by the doping level difference from a normal gate. Therefore, it is foreseeable that this device could be useful for comparator applications.

With this invention, a depletion mode device may be formed using conventional CMOS technology and processing steps, and without the use of additional masking and implanting steps. While our invention has been described in terms of preferred embodiments, it is apparent that other forms could be adopted by one skilled in the art, such as by substituting dopants, processing techniques, or using the analogous steps with an n-channel device. Accordingly the scope of our invention is to be limited only by the following claims.

What is claimed is:

1. A method for forming a p-channel depletion device in an MOSFET comprising the following steps:

forming an N-well region of conductivity type within an appropriate substrate;

forming a polysilicon gate over said N-well region which is characterized by a N− conductivity type; and implanting boron into said N-well region to form source and drain regions of P+ type conductivity while concurrently counter doping said gate, so that said gate is now characterized by a P- type conductivity;

such that the threshold voltage of the p-channel depletion device is approximately +250 millivolts or greater.

* * * * *